(12) United States Patent
Uemura et al.

(10) Patent No.: US 10,622,186 B2
(45) Date of Patent: Apr. 14, 2020

(54) CHARGED PARTICLE BEAM WRITING APPARATUS AND CHARGED PARTICLE BEAM WRITING METHOD

(71) Applicant: NuFlare Technology, Inc., Yokohama-shi (JP)

(72) Inventors: Takuya Uemura, Yokohama (JP); Takashi Nakamura, Yokohama (JP); Hideki Matsui, Yokohama (JP); Munehiro Ogasawara, Hiratsuka (JP); Rieko Nishimura, Yokohama (JP); Tatsuya Murofushi, Gotemba (JP); Yoshiaki Hattori, Toshima-ku (JP)

(73) Assignee: NuFlare Technology, Inc., Yokohama-shi (JP)

( * ) Notice: Subject to any disclaimer, the term of this patent is extended or adjusted under 35 U.S.C. 154(b) by 0 days.

(21) Appl. No.: 16/202,514

(22) Filed: Nov. 28, 2018

(65) Prior Publication Data
US 2019/0189389 A1 Jun. 20, 2019

(30) Foreign Application Priority Data
Dec. 14, 2017 (JP) .................................. 2017-239397

(51) Int. Cl.
*H01J 37/21* (2006.01)
*H01J 37/147* (2006.01)
(Continued)

(52) U.S. Cl.
CPC .............. *H01J 37/21* (2013.01); *H01J 37/10* (2013.01); *H01J 37/1472* (2013.01); (Continued)

(58) Field of Classification Search
CPC ........ H01J 37/21; H01J 37/10; H01J 37/1472; H01J 37/20; H01J 37/3174; H01J 2237/202; H01J 2237/31793
(Continued)

(56) References Cited

U.S. PATENT DOCUMENTS

| 7,679,068 | B2 * | 3/2010 | Kamikubo | ............. B82Y 10/00 250/396 R |
| 2002/0027199 | A1 * | 3/2002 | Inada | ...................... G01N 23/04 250/311 |

(Continued)

FOREIGN PATENT DOCUMENTS

| JP | 59-32128 | 2/1984 |
| JP | 62-133715 | 6/1987 |

(Continued)

*Primary Examiner* — Nicole M Ippolito
(74) *Attorney, Agent, or Firm* — Oblon, McClelland, Maier & Neustadt, L.L.P.

(57) ABSTRACT

In one embodiment, a charged particle beam writing apparatus includes a deflector deflecting a charged particle beam, a first correcting lens and a second correcting lens correcting a focus position of the charged particle beam, a focus correction amount calculator calculating a first correction amount for the focus position according to a change in a height position of a sample surface, and calculating a second correction amount for the focus position according to a change in shot size of the charged particle beam, a first DAC (digital to analog converter) amplifier applying a voltage for a ground potential based on the first correction amount to the first correcting lens, and a second DAC amplifier applying a voltage for a ground potential based on the second correction amount to the second correcting lens, an output of the second DAC amplifier being smaller than an output of the first DAC amplifier.

10 Claims, 5 Drawing Sheets

(51) Int. Cl.
*H01J 37/10* (2006.01)
*H01J 37/317* (2006.01)
*H01J 37/20* (2006.01)

(52) U.S. Cl.
CPC .......... *H01J 37/20* (2013.01); *H01J 37/3174* (2013.01); *H01J 2237/202* (2013.01); *H01J 2237/31793* (2013.01)

(58) Field of Classification Search
USPC ......... 250/396 R, 397, 492.1, 492.2, 492.21, 250/492.22, 492.23, 492.3
See application file for complete search history.

(56) References Cited

U.S. PATENT DOCUMENTS

| | | | | |
|---|---|---|---|---|
| 2006/0151721 | A1* | 7/2006 | Nakasugi | B82Y 10/00 250/492.22 |
| 2011/0115637 | A1* | 5/2011 | Kikuchi | H01J 37/20 340/600 |

FOREIGN PATENT DOCUMENTS

| | | |
|---|---|---|
| JP | 8-264420 | 10/1996 |
| JP | 2001-93831 | 4/2001 |
| JP | 2006-80303 | 3/2006 |
| JP | 2007-123384 | 5/2007 |
| JP | 2011-71248 | 4/2011 |
| JP | 2015-109323 | 6/2015 |

\* cited by examiner

GROUP A  GROUP B

GROUP A  GROUP B

GROUP A  GROUP B

CHARGED PARTICLE BEAM WRITING APPARATUS AND CHARGED PARTICLE BEAM WRITING METHOD

CROSS REFERENCE TO RELATED APPLICATION

This application is based upon and claims benefit of priority from the Japanese Patent Application No. 2017-239397, filed on Dec. 14, 2017, the entire contents of which are incorporated herein by reference.

FIELD

The present invention relates to a charged particle beam writing apparatus and a charged particle beam writing method.

BACKGROUND

As LSI circuits are increasing in density, the line width of circuits of semiconductor devices is becoming finer. To form a desired circuit pattern onto a semiconductor device, a method of reducing and transferring, by using a reduction-projection exposure apparatus, onto a wafer a highly precise original image pattern (mask, or reticle, in particular, when used in a stepper or a scanner) formed on a quartz is employed. The highly precise original image pattern is written by using an electron beam writing apparatus, in which a technology commonly known as electron beam lithography is used.

A writing apparatus which performs electron beam writing on a mask includes, for instance, a first aperture plate in which a rectangular opening is formed, and a second aperture plate in which a variable shaping opening is formed. An electron beam which has passed through an opening of the first aperture plate and has been shaped in a rectangular form is deflected by a deflector, passes through a variable shaping opening of the second aperture plate, and is shaped in desired shape and size. An electron beam which has passed through the second aperture plate is emitted to a sample placed on a movable stage.

When a variation in a sample surface in the height direction occurs due to bending or the like of the sample, the sample surface and an optimal focus are misaligned, and a pattern dimensional accuracy deteriorates. Therefore, a correction lens is provided which corrects a focal point deviation associated with a variation in the height direction of the sample surface, and the focal point variation is corrected during writing.

The optimal focus also varies with shot size. Therefore, it is preferable that a focus variation amount due to a shot size be corrected. The above-mentioned correcting lens may be used for correction of the focus variation amount due to a shot size. However, the focus variation amount associated with a variation in the height direction of the sample surface is greater than the focus variation amount due to a shot size. Therefore, the output of the DAC (digital to analog conversion) amplifier, which applies a voltage to the above-mentioned correcting lens, is greater than necessary, and a throughput is reduced due to a long waiting time until the output of the DAC amplifier is stabilized.

DETAILED DESCRIPTION

In one embodiment, a charged particle beam writing apparatus includes a discharger discharging a charged particle beam, a stage which is movable, and on which a sample as a writing target is placed, a deflector deflecting the charged particle beam, a first correcting lens and a second correcting lens correcting a focus position of the charged particle beam, a focus correction amount calculator calculating a first correction amount for the focus position of the charged particle beam according to a change in a height position of a sample surface, and calculating a second correction amount for the focus position of the charged particle beam according to a change in shot size of the charged particle beam, a first DAC (digital to analog converter) amplifier applying a voltage for a ground potential based on the first correction amount to the first correcting lens, and a second DAC amplifier applying a voltage for a ground potential based on the second correction amount to the second correcting lens, an output of the second DAC amplifier being smaller than an output of the first DAC amplifier.

Hereinafter, the configuration using an electron beam will be described as an example of a charged particle beam in an embodiment. However, the charged particle beam is not limited to an electron beam, and may be a beam using a charged particle, such as an ion beam. In addition, a variable shaping-type writing apparatus will be described as an example of a charged particle beam apparatus.

Figure 1:
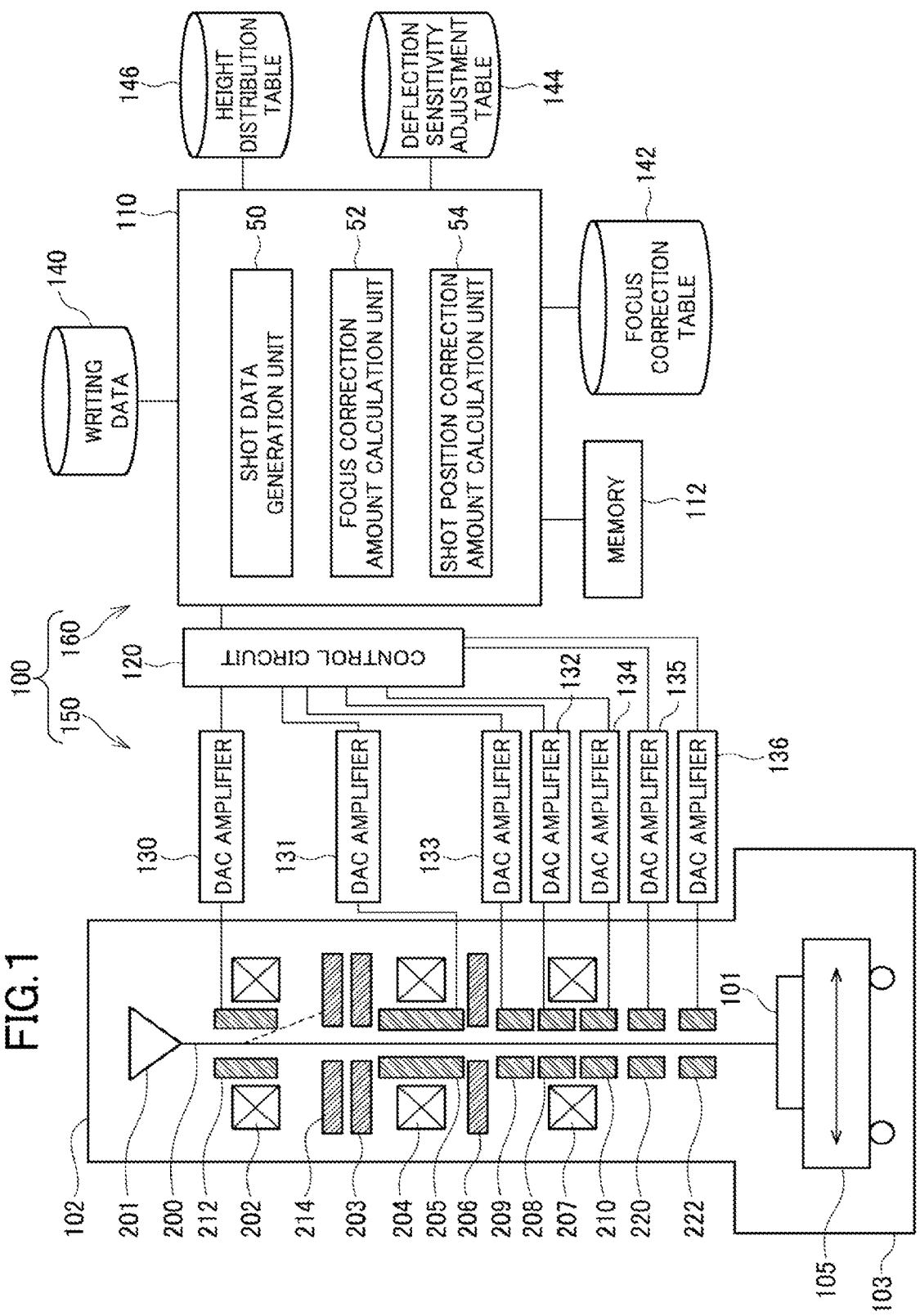
FIG. 1 is a schematic configuration diagram of a writing apparatus according to an embodiment of the present invention.

FIG. 1 is a conceptual diagram illustrating a configuration of a writing apparatus in the embodiment. A writing apparatus 100 includes a writing unit 150 and a control unit 160. The writing unit 150 includes an electron lens barrel 102 and a writing chamber 103. In the electron lens barrel 102, an electron gun 201, an illumination lens 202, a blanking deflector (blanker) 212, a blanking aperture 214 (a blanking aperture plate), a first shaping aperture 203 (a first shaping aperture plate), a projection lens 204, a shaping deflector 205, a second shaping aperture 206 (a second shaping aperture plate), an objective lens 207, a main deflector 208, a sub-deflector 209, a tertiary deflector 210 (a sub-sub-deflector), a first correcting lens 220, and a second correcting lens 222 are disposed.

Although FIG. 1 illustrates a configuration in which the first correcting lens 220 and the second correcting lens 222 are provided below the tertiary deflector 210, the positions of the first correcting lens 220 and the second correcting lens 222 are not particularly limited, and may be above the sub-deflector 209, for instance.

An XY stage 105, which is movable in at least XY directions, is disposed in the writing chamber 103. A sample 101 (substrate), which is a writing target and to which resist is applied, is disposed on the XY stage 105. The sample 101 includes an exposure mask and a silicon wafer for manufacturing a semiconductor device. The mask includes mask blanks.

The control unit 160 includes a control computer 110, a memory 112, a control circuit 120, DAC (digital to analog converter) amplifiers 130 to 136, and storage devices 140, 142, 144, 146 such as a magnetic disk drive. The control computer 110 is connected to the memory 112, the control circuit 120 and the storage device 140, 142, 144, 146.

The DAC amplifiers 130 to 136 are connected to the control circuit 120. The DAC amplifier 130 is connected to the blanking deflector 212. The DAC amplifier 131 is connected to the shaping deflector 205.

The DAC amplifier 132 is connected to the main deflector 208. The DAC amplifier 133 is connected to the secondary deflector 209. The DAC amplifier 134 is connected to the sub-secondary deflector 210.

The DAC amplifier 135 is connected to the first correcting lens 220. The DAC amplifier 136 is connected to the second correcting lens 222.

The control computer 110 includes a shot data generation unit 50, a focus correction amount calculation unit 52, and a shot position correction amount calculation unit 54. The functions of the shot data generation unit 50, the focus correction amount calculation unit 52, and the shot position correction amount calculation unit 54 may be configured by software, or may be configured by hardware. A result of calculation by the control computer 110 is stored in the memory 112 each time.

Figure 2:
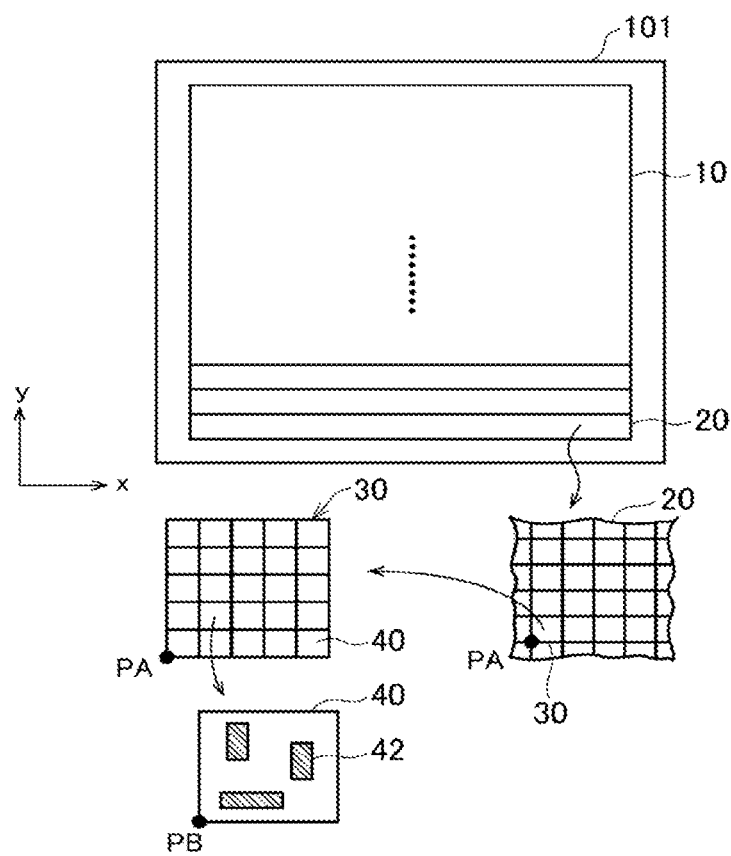
FIG. 2 is a conceptual diagram for explaining a deflection area.

FIG. 2 is a conceptual diagram for explaining deflection areas of the main deflector 208, the secondary deflector 209, and the sub-secondary deflector 210. In FIG. 2, a writing area 10 of the sample 101 is virtually divided into multiple rectangular stripe areas 20, for instance, in the y direction with a possible deflection width of the main deflector 208. The deflection areas (the main deflection areas) of the main deflector 208 are the areas obtained by dividing the stripe area 20 in the x direction with a possible deflection width of the main deflector 208.

The main deflection areas are virtually divided into multiple mesh-shaped subfields (SF) 30 with a possible deflection width of the secondary deflector 209. Each SF 30 is then virtually divided into multiple mesh-shaped under subfields (here, "TF", the abbreviation of Tertiary Deflection Field meaning a third deflection is used, and the same is applied hereinafter) 40 with a possible deflection width of the sub-secondary deflector 216.

A shot graphic is written at each shot position 42 of each TF 40. In this manner, the deflection areas deflected by each of three stage deflectors that deflect the electron beam 200 are the main deflection area, the SF 30, and the TF 40 in descending order of area size. The greater the size of a deflection area, the greater the output of an amplifier connected. Therefore, the output of the DAC amplifier 132 is the greatest, and the output of the DAC amplifier 134 is the smallest in the DAC amplifiers 132, 133, and 134.

The writing apparatus 100 performs writing processing on each of the stripe areas 20 using the multiple stage deflectors. Here, as an example, three stage deflectors are used, which are the main deflector 208, the secondary deflector 209, and the sub-secondary deflector 210. The writing apparatus 100 performs writing processing on a first stripe area 20 in the x direction, while the XY stage 105 is being continuously moved, for instance, in -x direction. After writing on the first stripe area 20 is completed, similarly, or in an opposite direction, writing on a second stripe area 20 is performed. Hereinafter, writing on a third stripe area 20 is performed similarly.

The electron beam 200 is sequentially deflected to a reference position PA of the SF 30 so that the main deflector 208 follows the movement of the XY stage 105. In addition, the secondary deflector 209 sequentially deflects the electron beam 200 from the reference position PA of each SF 30 to a reference position PB of each TF 40. The sub-secondary deflector 210 then deflects the electron beam 200 from the reference position PB of each TF 40 to a shot position 42 of the beam emitted into the TF 40.

A digital signal for blanking control is outputted from the control circuit 120 to the DAC amplifier 130. The DAC amplifier 130 converts the digital signal to an analog signal, amplifies the analog signal, and applies the amplified signal to the blanking deflector 212 as a deflection voltage. The electron beam 200 is deflected by the deflection voltage, and blanking control of each shot is performed.

A digital signal for shaping deflection is outputted from the control circuit 120 to the DAC amplifier 131. The DAC amplifier 131 converts the digital signal to an analog signal, amplifies the analog signal, and applies the amplified signal to the shaping deflector 205 as a deflection voltage. The electron beam 200 is deflected by the deflection voltage to a specific position of the second shaping aperture 206, and an electron beam having desired dimensions and shape is formed.

A digital signal for main deflection control is outputted from the control circuit 120 to the DAC amplifier 132. The DAC amplifier 132 converts the digital signal to an analog signal, amplifies the analog signal, and applies the amplified signal to the main deflector 208 as a deflection voltage. The electron beam 200 is deflected by the deflection voltage, and is deflected to the reference position PA (for instance, the center position or the lower left corner position of the relevant SF) of predetermined subfields (SF) in which the beam of each shot is virtually divided into mesh shapes. When writing is performed while the XY stage 105 is being continuously moved, the deflection voltage also includes a tracking deflection voltage which follows stage movement.

A digital signal for secondary deflection control is outputted from the control circuit 120 to the DAC amplifier 133. The DAC amplifier 132 converts the digital signal to an analog signal, amplifies the analog signal, and applies the amplified signal to the secondary deflector 209 as a deflection voltage. The electron beam 200 is deflected by the deflection voltage, and is deflected to the reference position PB (for instance, the center position or the lower left corner position of the relevant TF) of the TF 40 in which the beam of each shot forms a minimum deflection area.

A digital signal for sub-secondary deflection control is outputted from the control circuit 120 to the DAC amplifier 134. The DAC amplifier 134 converts the digital signal to an analog signal, amplifies the analog signal, and applies the amplified signal to the sub-secondary deflector 210 as a deflection voltage. The electron beam 200 is deflected by the deflection voltage, and the beam of each shot is deflected to each shot position 42 in the TF 40.

In addition, a digital signal is outputted from the control circuit 120 to the DAC amplifier 134, the digital signal for correcting the shot position which is moved by variation in deflection sensitivity caused by focus adjustment. The DAC amplifier 134 converts the digital signal to an analog signal, amplifies the analog signal, and applies the amplified signal to the sub-secondary deflector 210 as a deflection voltage.

The electron beam 200 is deflected by the deflection voltage, and the shot position is corrected.

A digital signal for focal point position adjustment of the electron beam 200 is outputted from the control circuit 120 to the DAC amplifier 135. The DAC amplifier 135 converts the digital signal to an analog signal, amplifies the analog signal, and applies the amplified signal to the first correcting lens 220 (electrostatic lens) as a focus correction voltage.

A digital signal for focal point position adjustment of the electron beam 200 is outputted from the control circuit 120 to the DAC amplifier 136. The DAC amplifier 136 converts the digital signal to an analog signal, amplifies the analog signal, and applies the amplified signal to the second correcting lens 222 (electrostatic lens) as a focus correction voltage.

The first correcting lens 220 corrects the focal point position of the electron beam 200 with changes in the surface height of the sample 101. The second correcting lens 222 corrects the focal point position of the electron beam 200 with changes in the shot size. The amount of adjustment (the amount of change) of the focal point position of the electron beam 200 made by the second correcting lens 222 is smaller than the amount of adjustment made by the first correcting lens 220. For this reason, an amplifier having a smaller output voltage and a shorter stable waiting time for output than those of the DAC amplifier 135 is used as the DAC amplifier 136.

The storage device 140 stores writing data. The writing data is the data obtained by performing processing, such as graphic division or format conversion, on design data (layout data), the processing being suitable for the writing apparatus.

The storage device 142 stores a focus correction table. The focus amendment table shows a correspondence relationship between a shot size and a focus position in the height direction. Instead of the table, a function for calculating a focus position from a shot size may be stored in the storage device 142.

The deflection sensitivity of the deflectors (the main deflector 208, the secondary deflector 209, and the sub-secondary deflector 210) are varied by focus adjustment, and deviation of the shot position occurs. Thus, the deviation needs to be corrected. The storage device 144 stores the deflection sensitivity adjustment table. The deflection sensitivity adjustment table records the coefficients of an expression for calculating the amount of movement (deviation) of the shot position due to the focus adjustment. The coefficients are set for each focus.

For instance, the amounts of movement $\Delta X$, $\Delta Y$ of the shot position in the X direction, the Y direction are determined by the following Expression 1. The coefficients recorded in the deflection sensitivity adjustment table are a0, a1, a2, b0, b1, b2, and the subscripts M, S, T indicate the main deflection area, SF, TF, respectively. $x_M$, $x_S$, $x_T$, $y_M$, $y_S$, $y_T$ show the deflection positions in each deflection area. For instance, $x_M$ and $y_M$ are the above-mentioned reference position PA, and $x_S$ and $y_S$ are the reference positions PB.

$$\Delta X = (a0_M + a0_S + a0_T) + (a1_M x_M + a1_S x_S + a1_T x_T) + (a2_M y_M + a2_S y_S + a2_T y_T) + \ldots \Delta Y = (b0_M + b0_S + b0_T) + (b1_M x_M + b1_S x_S + b1_T x_T) + (b2_M y_M + b2_S y_S + b2_T y_T) +$$
Expression 1

The storage device 146 stores height distribution data of the surface of the sample 101. The surface height of the sample 101 is the data pre-measured using a height sensor (illustration is omitted) which combines a light projector and a light receiver provided in the writing chamber 103. The light emitted from the light projector is reflected on the sample surface, and reflected light is received by the light receiver. Thus the height of the sample surface is measured.

The shot data generation unit 50 performs data conversion processing in multiple stages on the writing data stored in the storage device 140, divides each graphic pattern which is a writing target into shot graphics each having a size which can be emitted by a single shot, and generates shot data which serves as a format specific to the writing apparatus. For instance, a graphic code indicating a graphic type of each shot graphic, a graphic size (shot size), and a writing position are defined as the shot data for each shot. The shot data is outputted to the control circuit 120.

When the electron beam 200 discharged from the electron gun 201 (discharge unit) passes through in the blanking deflector 212, the electron beam 200 is deflected by the blanking deflection unit 212 so that for instance, in a state of beam ON, the electron beam 200 is passed through the blanking aperture 214, and in a state of beam OFF, the entire beam is blocked by the blanking aperture 214. Transition is made from a state of beam OFF to beam ON, and subsequently, the electron beam 200, which has passed through the blanking aperture 214 in a period until beam OFF forms the electron beam for one shot.

The electron beam 200 of each shot generated by the shot passing through the blanking deflector 212 and the blanking aperture 214 illuminates the entire first shaping aperture 203 having a rectangular hole by the illumination lens 202. Here, the electron beam 200 is first shaped in a rectangular form.

The electron beam 200 of a first aperture image, which has passed through the first shaping aperture 203, is projected onto the second shaping aperture 206 by the projection lens 204. Deflection control is performed on the first aperture image on the second shaping aperture 206 by the shaping deflector 205, and the beam shape and dimensions can be changed (variable shaping can be performed). Such variable shaping is performed for each shot, and the electron beam 200 can be shaped to a beam shape and dimensions varying with each shot.

The electron beam 200 of a second aperture image, which has passed through the second shaping aperture 206, is focused to a focal point by the objective lens 207, deflected by the main deflector 208, the secondary deflector 209, and the sub-secondary deflector 216, and emitted to a desired position of the sample 101 disposed on the XY stage 105 which is continuously moved.

The focus deviation, depending on the sample surface height, of the electron beam 200 emitted to the sample 101 is dynamically corrected in real time by the first correcting lens 220. In addition, the focus deviation, depending on the shot size, of the electron beam 200 emitted to the sample 101 is dynamically corrected in real time by the second correcting lens 222.

The focus correction amount calculation unit 52 refers to the height distribution data stored in the storage device 146, and calculates a first correction amount for correcting the position of a focal point of the electron beam 200 according to a change in the height position of the sample surface. The first correction amount is outputted to the DAC amplifier 135 via the control circuit 120. The DAC amplifier 135 converts the first correction amount which is a digital signal to an analog signal, and applies the analog signal to the first correcting lens 220 as a focus correction voltage. Consequently, the focus deviation depending on the sample surface height is corrected.

The focus correction amount calculation unit 52 refers to the focus adjustment table stored in the storage device 142, and calculates a second correction amount for correcting the position of a focal point of the electron beam 200 according to a change in the shot size (shot area) defined in the shot data. The second correction amount is outputted to the DAC amplifier 136 via the control circuit 120. The DAC amplifier 136 converts the second correction amount which is a digital signal to an analog signal, and applies the analog signal to the second correcting lens 222 as a focus correction voltage. Consequently, the focus deviation depending on the shot size is corrected.

The shot position correction amount calculation unit 54 calculates the amount of movement of the shot position associated with the focus adjustment made by the second correcting lens 222 (and the first correcting lens 220). The shot position correction amount calculation unit 54 selects coefficients corresponding to a focus value after the adjustment from the deflection sensitivity adjustment table stored in the storage device 144, substitutes the deflection position in each deflection area based on the writing position defined in the shot data into Expression 1 using these coefficients, and calculates the amounts of movement ΔX, ΔY of the shot position.

The amounts of movement ΔX, ΔY of the shot position are outputted to the DAC amplifier 134 via the control circuit 120. The DAC amplifier 134 converts the shot position movement amounts (shot position correction amounts) which are each a digital signal to an analog signal, and applies the analog signal to the sub-secondary deflector 210 as a shot position correction amount. Consequently, the deviation in the shot position caused by focus adjustment is corrected.

In this manner, according to this embodiment, a focus deviation depending on the shot size is quickly corrected using the second correcting lens 222 connected to the DAC amplifier 136 having a small output, and thus reduction of the throughput can be suppressed.

In addition, variation (movement of the shot position) in deflection sensitivity caused by focus correction at the time of shot size variation is quickly corrected by the sub-secondary deflector 210 that operates with the DAC amplifier 134 having a low output voltage, and it is possible to achieve a favorable writing accuracy. When a focus variation is large and a movement amount of the shot position is large, the shot position may be corrected using the secondary deflector 209.

Although an example has been described in which a focus deviation depending on the shot size is corrected using the second correcting lens 222 in the embodiment, the first correcting lens 220 and the second correcting lens 222 may be used together. Coarse adjustment of focus is made by the first correcting lens 220, and fine adjustment of focus is made by the second correcting lens 222. This is particularly effective when the difference between shot sizes in an area is large, and for instance, two types of techniques mentioned below are applicable.

[First Technique]

Figure 3A:
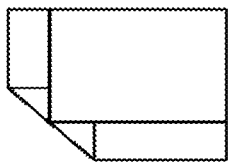
FIG. 3A is a figure illustrating an example of a shot graphic.
Figure 3B:
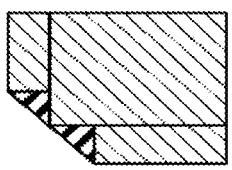
FIGS. 3B to 3D are each a figure illustrating an example of grouping of shot data.
Figure 3C:
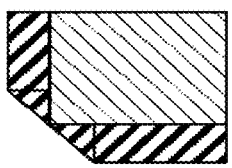
Figure 3D:
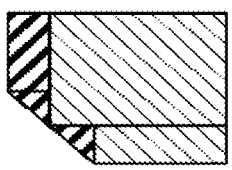

Multiple pieces of shot data in an area are classified into two groups, and a combination of groups is determined, which provides a minimum of the sum of "the shot area variation×the number of pieces (the number of shots)". For instance, the shot data illustrated in FIG. 3A is divided into group A and group B as in FIGS. 3B to 3D by changing the combination. In this example, the combination illustrated in FIG. 3D provides a minimum of the sum of "the shot area variation×the number of pieces" of the group A and "the shot area variation×the number of pieces" of the group B.

Figure 3E:
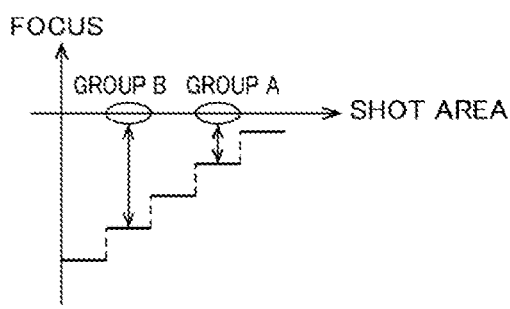
FIGS. 3E, 3F are graphs illustrating an example of focal adjustment based on a shot area.

Next, coarse adjustment of a focus corresponding to the shot area of each of the groups A, B is made using the first correcting lens 220. For instance, as illustrated in FIG. 3E, coarse adjustment of focus is made.

Figure 3F:
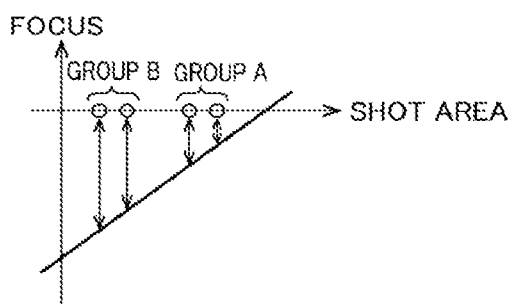

Subsequently, fine adjustment of a focus corresponding to each shot area is made using the second correcting lens 222. For instance, as illustrated in FIG. 3F, fine adjustment of focus is made.

[Second Technique]

Figure 4A:
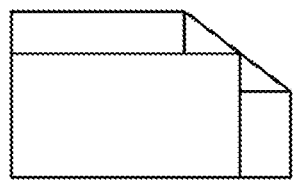
FIG. 4A is a figure illustrating an example of a shot graphic.
Figure 4B:
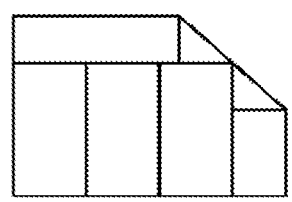
FIG. 4B is a figure illustrating a division example of a graphic having a large shot size.

A graphic having a large shot size in an area is divided until the variation in shot area is reduced to a threshold value or less. For instance, a graphic having a large shot size among the graphics included in the shot data illustrated in FIG. 4A is divided as illustrated in FIG. 4B. Then an average shot area is calculated, and coarse adjustment of a focus corresponding to the average shot area is made using the first correcting lens 220. Subsequently, fine adjustment of a focus corresponding to each shot area is made using the second correcting lens 222.

With the first technique, the number of operations the DAC amplifier 135 which applies a voltage to the first correcting lens 220 is greater and the stable waiting time for an amplifier output is longer, as compared with the second technique. In contrast, with the second technique, the number of shots is greater, as compared with the first technique. The control computer 110 calculates the time taken for writing when the first technique is adopted, and the time taken for writing when the second technique is adopted, and a technique providing a better throughput is preferably used.

In the embodiment, a configuration has been described in which the first correcting lens 220 and the second correcting lens 222 are provided separately from the deflectors (the main deflector 208, the secondary deflector 209, and the sub-secondary deflector 210). However, the first correcting lens 220 or the second correcting lens 222 may be included in the deflectors.

Figure 5:
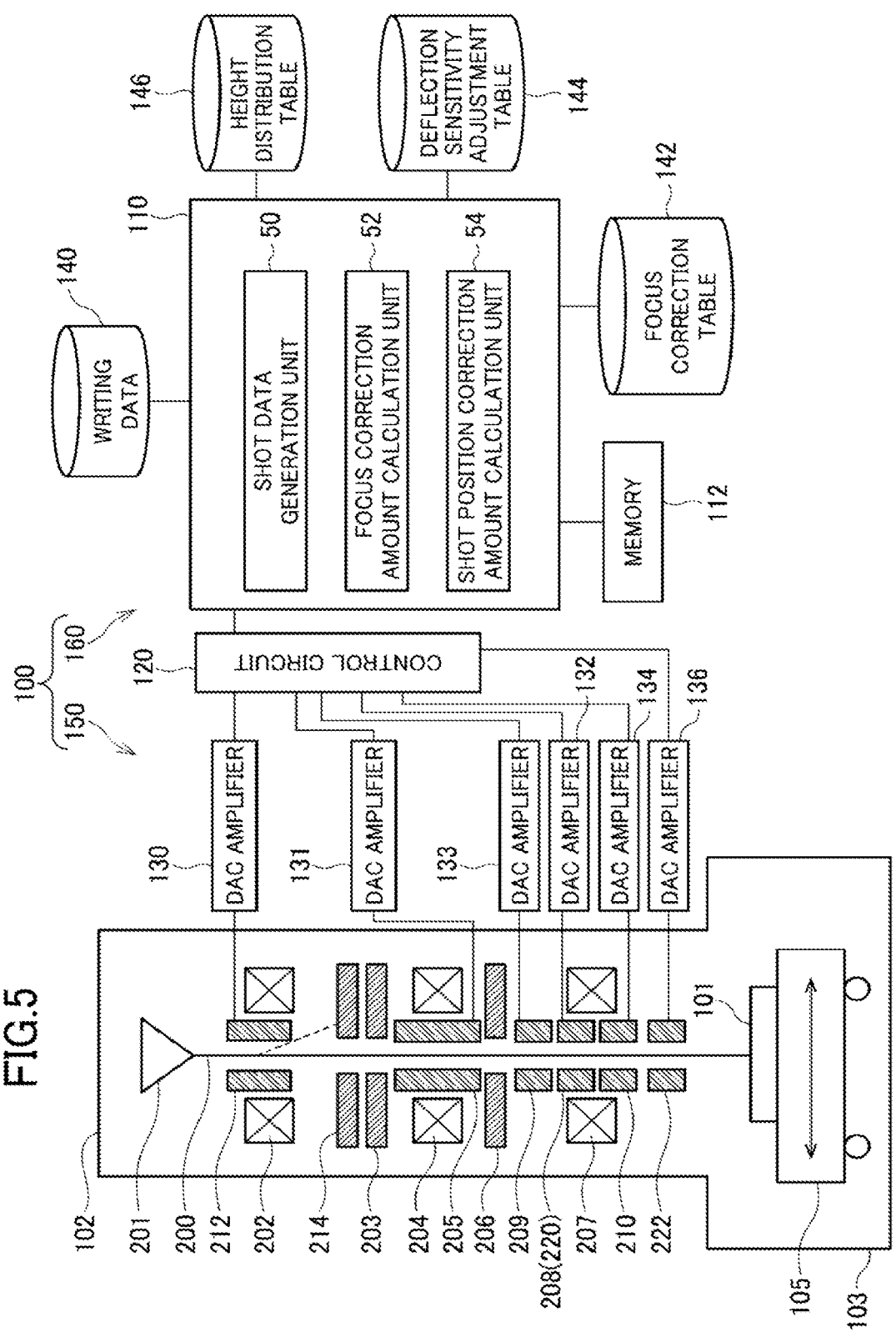
FIG. 5 is a schematic configuration diagram of a writing apparatus according to another embodiment.

For instance, as illustrated in FIG. 5, the first correcting lens 220 may be included in the main deflector 208 that operates with an amplifier having a high output voltage. In this case, a focus correction voltage for correcting a focus deviation depending on the sample surface height is superimposed on a deflection voltage applied to the main deflector 208.

Figure 6:
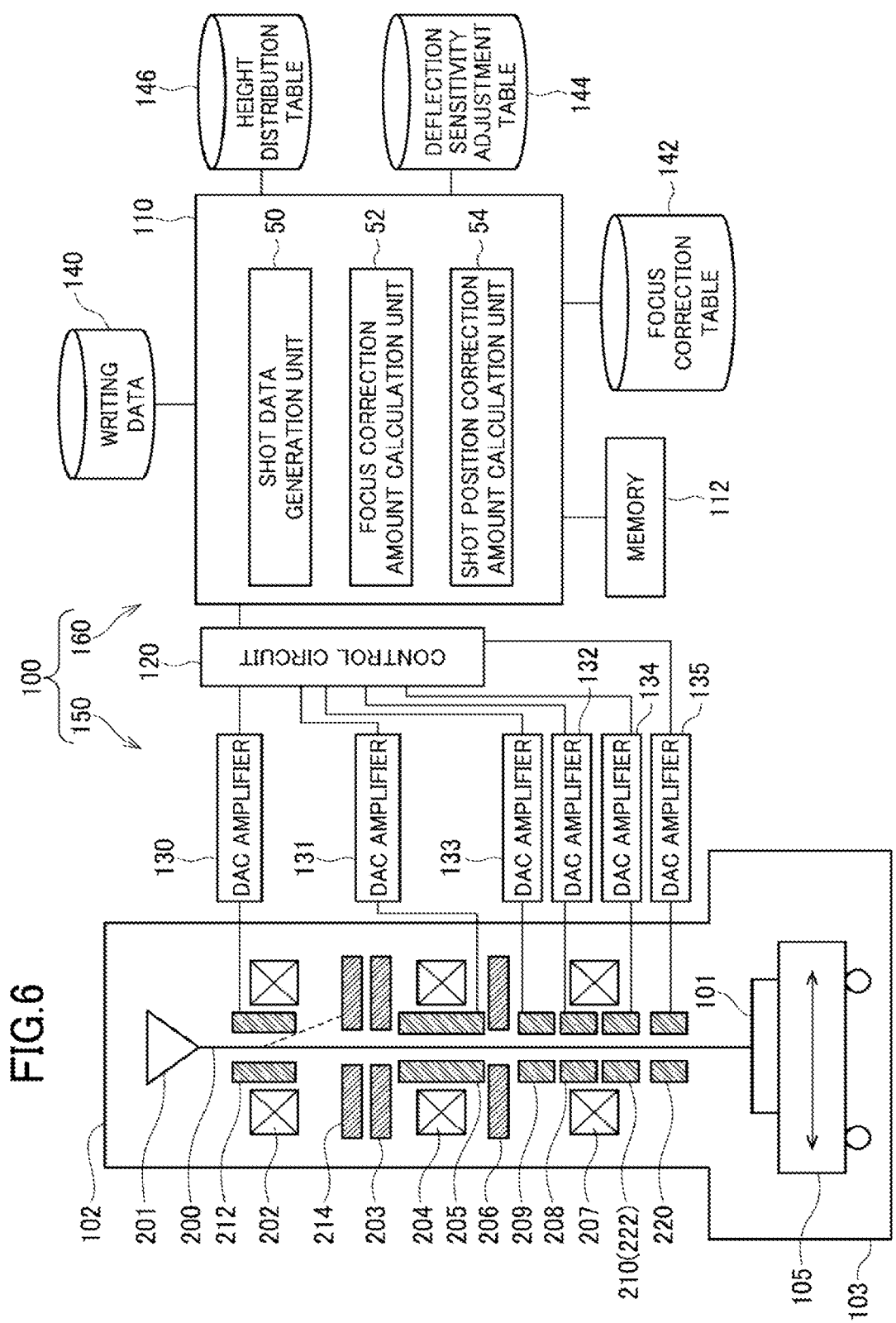
FIG. 6 is a schematic configuration diagram of a writing apparatus according to another embodiment.

As illustrated in FIG. 6, the second correcting lens 222 may be included in the sub-secondary deflector 210 that operates with an amplifier having a low output voltage. In this case, a focus correction voltage for correcting a focus deviation depending on the shot size is superimposed on a deflection voltage applied to the sub-secondary deflector 210.

The second correcting lens 222 may be included in the secondary deflector 209.

Although the writing apparatus including three stage deflectors has been described, the deflectors may be in two stages, or four or more stages.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A charged particle beam writing apparatus comprising:
a discharger discharging a charged particle beam;

a stage which is movable, and on which a sample as a writing target is placed;

a deflector deflecting the charged particle beam;

a first correcting lens and a second correcting lens correcting a focus position of the charged particle beam;

a focus correction amount calculator calculating a first correction amount for the focus position of the charged particle beam according to a change in a height position of a sample surface, and calculating a second correction amount for the focus position of the charged particle beam according to a change in shot size of the charged particle beam;

a first DAC (digital to analog converter) amplifier applying a voltage for a ground potential based on the first correction amount to the first correcting lens; and a second DAC amplifier applying a voltage for a ground potential based on the second correction amount to the second correcting lens, an output of the second DAC amplifier being smaller than an output of the first DAC amplifier.

2. The apparatus according to claim 1, wherein the deflector includes:

a first deflector deflecting the charged particle beam to a reference position of each of a plurality of first small areas in which a writing area of the sample is virtually divided into mesh-shaped areas so as to follow movement of the stage;

a second deflector deflecting the charged particle beam from the reference position of each of the plurality of first small areas to a reference position of each of a plurality of second small areas in which the plurality of first small areas are virtually divided into mesh-shaped areas; and a third deflector deflecting the charged particle beam from the reference position of each of the plurality of second small areas to a shot position of a beam emitted into the plurality of second small areas, and the first correcting lens is included in the first deflector.

3. The apparatus according to claim 1, wherein the deflector includes:

a first deflector deflecting the charged particle beam to a reference position of each of a plurality of first small areas in which a writing area of the sample is virtually divided into mesh-shaped areas so as to follow movement of the stage;

a second deflector deflecting the charged particle beam from the reference position of each of the plurality of first small areas to a reference position of each of a plurality of second small areas in which the plurality of first small areas are virtually divided into mesh-shaped areas; and a third deflector deflecting the charged particle beam from the reference position of each of the plurality of second small areas to a shot position of a beam emitted into the plurality of second small areas, and the second correcting lens is included in the third deflector.

4. The apparatus according to claim 1, wherein the first correcting lens and the second correcting lens are separate bodies from the deflector.

5. The apparatus according to claim 1, further comprising a shot position correction amount calculator calculating a correction amount for a shot position which is moved associated with correction of the focus position made by the second correcting lens, wherein the deflector deflects the charged particle beam so that the shot position of the charged particle beam is corrected based on the shot position correction amount.

6. The charged particle beam writing apparatus according to claim 1, wherein shot data in an area is classified into a first group and a second group so that a sum of a product of a variation in shot area and a number of shots attains a minimum, coarse adjustment of a focus corresponding to the shot area of each of the first group and the second group is made using the first correcting lens, and fine adjustment of a focus corresponding to each shot area is made using the second correcting lens.

7. The charged particle beam writing apparatus according to claim 1, wherein a graphic in an area divided so that a variation in shot area is reduced to a threshold value or less to generate shot data, and an average shot area is calculated, coarse adjustment of a focus corresponding to the average shot area is made using the first correcting lens, and fine adjustment of a focus corresponding to each shot area is made using the second correcting lens.

8. A charged particle beam writing method of writing a pattern on a sample by deflecting a charged particle beam with a deflector, the method comprising:

calculating a first correction amount for a focus position of the charged particle beam according to a change in a height position of a sample surface;

calculating a second correction amount for the focus position of the charged particle beam according to a change in shot size of the charged particle beam;

applying a voltage for a ground potential based on the first correction amount to the first correcting lens by a first DAC (digital to analog converter) amplifier, and correcting the focus position of the charged particle beam; and applying a voltage for a ground potential based on the second correction amount to the second correcting lens by a second DAC amplifier having an output smaller than an output of the first DAC amplifier, and correcting the focus position of the charged particle beam.

9. The method according to claim 8, wherein shot data in an area is classified into a first group and a second group so that a sum of a product of a variation in shot area and a number of shots attains a minimum, coarse adjustment of a focus corresponding to the shot area of each of the first group and the second group is made using the first correcting lens, and fine adjustment of a focus corresponding to each shot area is made using the second correcting lens.

10. The method according to claim 8, wherein a graphic in an area divided so that a variation in shot area is reduced to a threshold value or less to generate shot data, and an average shot area is calculated, sparse adjustment of a focus corresponding to the average shot area is made using the first correcting lens, and fine adjustment of a focus corresponding to each shot area is made using the second correcting lens.

* * * * *